(12) United States Patent
Slessman

(10) Patent No.: US 8,300,410 B2
(45) Date of Patent: Oct. 30, 2012

(54) APPARATUS AND METHOD FOR REGULATING VARIOUS CONDITIONS AFFECTING ELECTRONIC EQUIPMENT

(75) Inventor: George Slessman, Scottsdale, AZ (US)

(73) Assignee: IO Data Centers, LLC, Phoenix, AZ (US)

( * ) Notice: Subject to any disclaimer, the term of this patent is extended or adjusted under 35 U.S.C. 154(b) by 29 days.

(21) Appl. No.: 12/837,167

(22) Filed: Jul. 15, 2010

(65) Prior Publication Data

US 2012/0014060 A1   Jan. 19, 2012

(51) Int. Cl.
*H05K 7/20* (2006.01)

(52) U.S. Cl. .............. 361/691; 361/679.48; 361/679.49; 361/679.5; 361/679.51; 361/695; 165/104.33; 165/104.34; 165/121; 454/184

(58) Field of Classification Search ............. 361/679.46, 361/679.47, 679.48, 679.49, 679.5, 679.53, 361/690–699, 721–727, 831; 165/80.2, 80.3, 165/121–126, 104.33, 185; 454/184, 186, 454/187, 228; 312/223.2, 223.3, 236, 262; 160/87, 127, 323.1, 313, 311, 184, 332, 337; 62/259.2, 407
See application file for complete search history.

(56) References Cited

U.S. PATENT DOCUMENTS

| | | | | |
|---|---|---|---|---|
| 6,034,873 A * | 3/2000 | Ståhl et al. | ..................... | 361/701 |
| 6,862,179 B2 * | 3/2005 | Beitelmal et al. | ........ | 361/679.53 |
| 7,170,745 B2 * | 1/2007 | Bash et al. | ..................... | 361/695 |
| 7,173,820 B2 * | 2/2007 | Fink et al. | ................. | 361/679.48 |
| 7,643,291 B2 * | 1/2010 | Mallia et al. | .................. | 361/695 |
| 7,992,402 B2 * | 8/2011 | VanGilder et al. | ........... | 62/259.2 |
| 8,037,644 B2 * | 10/2011 | Hall | ................................ | 52/69 |
| 8,040,673 B2 * | 10/2011 | Krietzman | .................... | 361/690 |
| 8,072,780 B1 * | 12/2011 | Roy | ............................... | 361/825 |
| 2010/0035535 A1 * | 2/2010 | Taylor | .......................... | 454/185 |
| 2010/0078157 A1 * | 4/2010 | Roth | ........................ | 165/104.34 |
| 2010/0108272 A1 * | 5/2010 | Karidis | ......................... | 160/238 |
| 2010/0230058 A1 * | 9/2010 | Mahoney | ....................... | 160/331 |
| 2011/0108207 A1 * | 5/2011 | Mainers et al. | ................. | 160/87 |

* cited by examiner

*Primary Examiner* — Michail V Datskovskiy
(74) *Attorney, Agent, or Firm* — Proskauer Rose LLP

(57) ABSTRACT

A system for thermal management of electronic equipment. The system can include a cabinet forming an enclosure for the electronic equipment, wherein the cabinet has an inlet and an outlet. Additionally, the system can include a supply channel connected with the cabinet inlet, wherein the cabinet is positioned on a floor and the supply channel is under the floor; an exhaust channel, wherein at least a portion of the exhaust channel is in proximity to the cabinet outlet. Furthermore, the system can include a plurality of flexible barriers forming a thermal curtain for directing air exiting the outlet of the cabinet to the exhaust channel, and wherein a position of the barriers is adjustable.

17 Claims, 8 Drawing Sheets

100

200

302 — Rivets to hold plastic curtain

Rail

300

APPARATUS AND METHOD FOR REGULATING VARIOUS CONDITIONS AFFECTING ELECTRONIC EQUIPMENT

CROSS-REFERENCES TO RELATED APPLICATIONS

This application is related to co-pending U.S. patent application Ser. No. 12/626,278 entitled "System And Method Of Providing Computer Resources" co-pending U.S. patent application Ser. No. 12/626,299 entitled "Apparatus and Method of Environmental Condition Management for Electronic Equipment" and U.S. patent application Ser. No. 12/837,233 entitled "Apparatus and Method for Regulating Environmental Conditions Associated with Equipment" filed contemporaneously herewith, the disclosures of which are hereby incorporated by reference in their entirety.

FIELD OF THE INVENTION

The present application relates to the management of environmental conditions associated with electronic equipment, and particularly to a system for regulating environmental conditions affecting electronic equipment, such as, but not limited to, servers, computers, and other electronic equipment.

BACKGROUND

Data centers are facilities that are often utilized to house various types of computer systems, servers, and other electronic equipment. Additionally, data centers typically include backup power supplies, redundant data communications connections, security devices, and environmental controls. Such environmental controls include air conditioning and fire protection and prevention systems. In a common configuration, data centers include cabinets which have servers or other electronic equipment mounted in rows within in the cabinet. The processors and other hardware contained within the servers or other electronic equipment typically generate significant amounts of heat. Generally speaking, the maximum allowed temperature range for a server in a data center is typically 59 to 90 degrees Fahrenheit, however, the recommended temperature is typically between 68 and 77 degrees Fahrenheit. If the temperature and/or other environmental conditions are not effectively controlled to reside within the recommended ranges, the processors and other hardware contained in the servers or other electronic equipment can malfunction or be otherwise rendered inoperable.

Since storage space for storing such hardware is expensive and limited, servers are often densely packed in the cabinets to maximize efficient usage of limited space. However, this further contributes to creating unfavorable environmental conditions since dense packing generates more heat. Currently, various solutions for cooling the servers exist in today's market. However, the majority of these solutions entail having to utilize a significant number of fans to generate a constant air flow across the servers and other electronic equipment to keep temperatures in a desired range. Such fans often require significant amounts of power to continuously run and are often susceptible to being unreliable.

Other solutions involve utilizing a raised floor system to channel cool air underneath the front-ends of the cabinets. Once the air is heated as it flows across the electronic equipment, the hot air escapes through a vented back door of the cabinet. The hot air is then guided to plenums or other similar devices in the ceiling, which then feed the hot air to devices which cool the hot air. As the performance of microprocessors continues to increase and as the need for more and more servers and other electronic equipment increase, the effective controlling of environmental conditions effecting such hardware becomes even more critical.

SUMMARY

In accordance with one aspect of the exemplary embodiments, a system for thermal management of electronic equipment can be provided. The system can include a cabinet forming an enclosure for the electronic equipment, where the cabinet has an inlet and an outlet. The system can also include a supply channel connected with the cabinet inlet, where the cabinet is positioned on a floor and the supply channel is under the floor; and an exhaust channel, where at least a portion of the exhaust channel is in proximity to the cabinet outlet. Furthermore, the system can include a plurality of flexible barriers forming a thermal curtain for directing air exiting the outlet of the cabinet to the exhaust channel, and where a position of the barriers is adjustable.

In accordance with another exemplary embodiment, a method can include, but is not limited to including, the steps of: providing air flow to electronic equipment contained in a cabinet by utilizing a plenum in fluid communication with a supply channel and an exhaust channel connected to the cabinet; and directing the air flow exiting the cabinet to the plenum by utilizing a thermal curtain formed by a plurality of flexible barriers, where a position of one or more of the barriers is adjustable.

In accordance with another exemplary embodiment, a thermal curtain for adjusting environmental conditions of a cabinet having electronic equipment, the thermal curtain comprising a plurality of flexible barriers for directing air flowing through the cabinet to an exhaust channel in fluid communication with the cabinet, where a plenum in fluid communication with the exhaust channel is adapted to direct the air to a cooling coil, and where the cooling coil is adapted to cool the air.

The above-described and other features and advantages of the present disclosure will be appreciated and understood by those skilled in the art from the following detailed description, drawings, and appended claims.

DETAILED DESCRIPTION OF THE INVENTION

The exemplary embodiments of the present disclosure are described with respect to a thermal management system for controlling environmental conditions affecting electronic equipment. It should be understood by one of ordinary skill in the art that the exemplary embodiments of the present disclosure can be applied to other types of thermal management systems. Additionally, features of the exemplary embodiments can be used with each other and/or with alternative features that are not shown.

Figure 1:
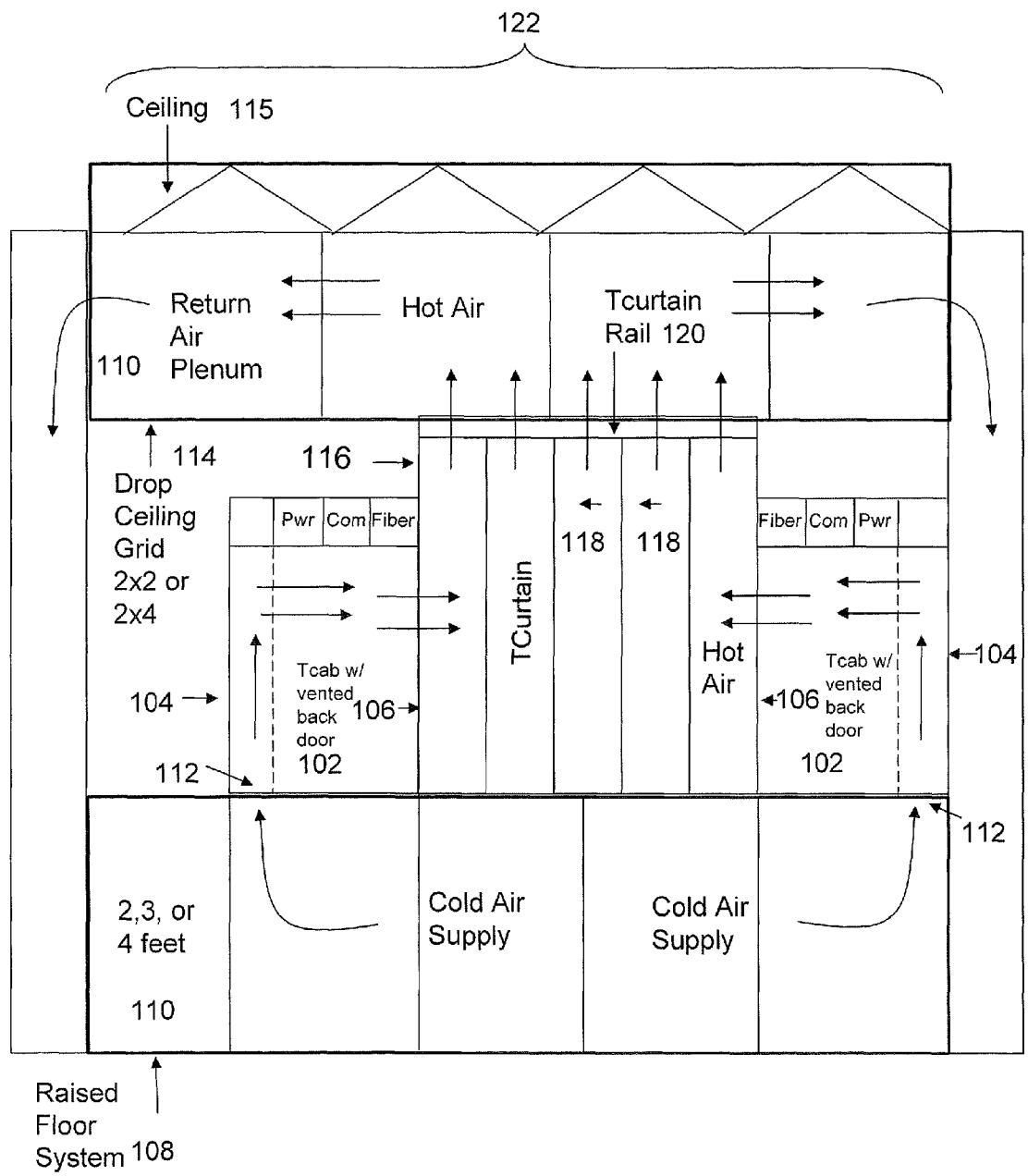
FIG. 1 illustrates a thermal management cabinet system, which according to an exemplary embodiment, includes a pair of vented thermal cabinets utilizing a thermal curtain for directing air heated by electronic equipment contained in the cabinets.

Referring to the drawings and in particular FIG. 1, an exemplary embodiment of a thermal management system 100 for controlling environmental conditions is illustrated. The thermal management system 100 can include a plurality of cabinets 102, which can be arranged in a variety of configurations. In FIG. 1, the cabinets 102 are arranged in two rows with their backs facing each other, however, other alternative arrangements can also be utilized. In an embodiment, the cabinets 102 can be arranged in staggered rows and/or other configurations, such as configurations which make the most efficient use of space and/or allow for easier adjustment of environmental conditions. The cabinets 102 can be utilized to store various types of electronic equipment or other equipment, such as servers, computers, storage devices, telecommunications devices, and other devices.

Each of the cabinets 102 can be configured to contain a plurality of rows/shelves for storing the electronic equipment. In one embodiment, the rows can be adjustable to a desired position. For example, some devices which generate more heat than others may require a greater distance between devices in adjacent rows than devices that generate less heat. Devices generating less heat can be more densely packed within the cabinets. The cabinets 102 can contain a top, bottom, and side walls, and can be accessed in the front via front doors 104 and accessed in the back by rear doors 106. The rear doors 106 can be vented so as to allow air to escape or otherwise flow out of the cabinets. Such a feature can be provided to ensure that the electronic equipment within the cabinets experience minimal overheating or other potentially harmful environmental conditions. In one embodiment, the cabinets 102 can include fans or other flow control devices to facilitate movement of the air into and out of the cabinets.

The thermal management system 100 can include a raised floor system 108, which can reside below the cabinets 102, such as shown in FIG. 1. The raised floor system 108 can be a false floor, which resides on top of an actual floor. Dimensions for the raised floor system 108 can, for example, be two, three or four feet for each section in the floor system 108. The raised floor system 108 can also include a cooling coil (not explicitly shown) and/or one or more plenums 110. The plenums 110 can include pressure sources for causing a pressure differential to cause air to flow through the floor system 108, and the cooling coil can be utilized to cool air is at reaches the coil. Cooled air can flow through the raised floor system 108, which can then be fed to the cabinets 102 via an opening 112 at the bottom of the cabinet.

Additionally, the management system 100 can also include a drop ceiling grid 114, which can be a false ceiling which can be positioned below an actual ceiling 115. The drop ceiling grid 114 can be divided into sections of various dimensions. For example, the sections can have measurements of two feet by four feet or two feet by two feet. The drop ceiling grid 114 can include one or more plenums 110, much like the raised floor system 108. The plenums 110 in the drop ceiling grid 114 can be utilized to direct air flow, such as hot air flow from the cabinets 102, to the raised floor system 108 or other areas for cooling. As shown in FIG. 1, the cabinets 102 can be positioned between the drop ceiling grid 114 and the raised floor system 108.

The thermal management system 100 can further include a thermal curtain 116, which can be utilized to direct hot air flowing from the rear doors 106 of the cabinets 102. The thermal curtain 116, for example, can direct hot air to the drop ceiling grid 114. Plenums 110 in the drop ceiling grid 114 can direct the hot air to cooling coils for cooling the hot air, which can then be supplied to the cabinets 102 via the raised floor system 108. Notably, the thermal curtain 116 can be comprised of a plurality of flexible barriers 118 and can be made of materials such as plastic or other similar materials. The flexibility of the barriers 118 can allow technicians to readily walk through the barriers 118, particularly at the ends of the thermal curtain 116 in order to access various portions of the cabinets 102. Additionally, the barriers 118 of the thermal curtain 116 can be configured to be transparent or clear, so that a technician or other individual can visualize cabling or other components associated with the electronic equipment in the cabinets 102. The degree of transparency can vary according to a number of factors including the particular components that are obstructed by the barriers 118.

The thermal curtain 116 can be configured to be connected to the drop ceiling grid 114 through the use of a rail 120. The rail 120 can be positioned between the thermal curtain 116 and the drop ceiling grid 114 and can feature rivets. The rivets can be utilized to hold the barriers 118 of thermal curtain 116. Each of the components described above can be housed within a thermal cage 122, which can house the components such as the drop grid ceiling 114 and the raised floor system 108 as one integrated movable unit.

Figure 2:
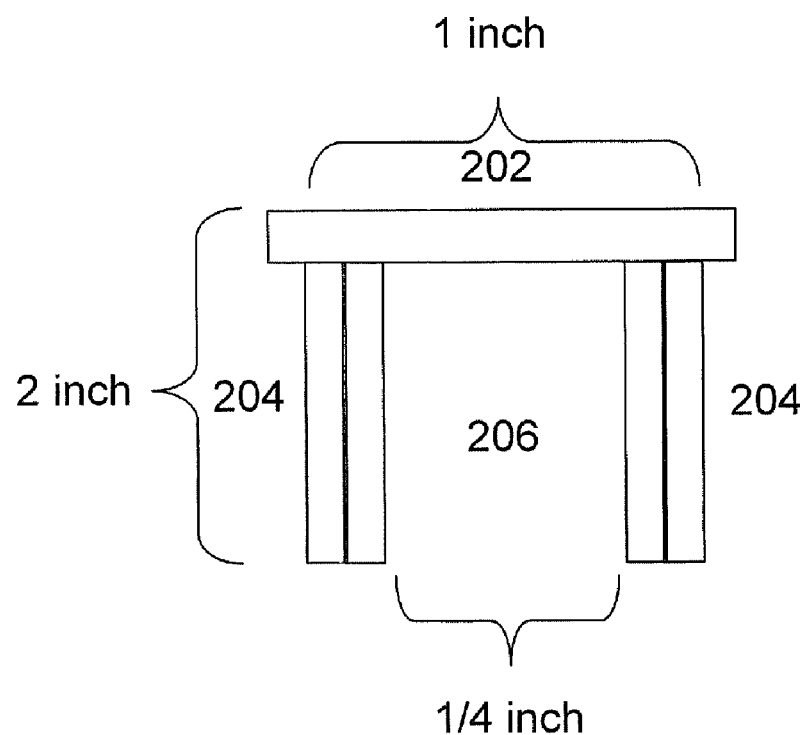
FIG. 2 illustrates an exemplary embodiment of a device for holding a barrier that is utilized in forming a thermal curtain.

Referring now also to FIG. 2, an end section 200 for holding a barrier 118 of the thermal curtain 116, is illustratively shown. The end section 200 can have varying dimensions, which, in this case is one inch across the top 202 of the end section 200 and two inches down the vertical sections 204 of the end section 200. The space 206 between the vertical sections of the end section 200 can be one fourth of an inch. Of course, the provided dimensions are for illustration only and the dimensions can be adjusted based on the circumstances. Notably, the end section 200 itself can be made of aluminum or other similar materials.

Figure 3:
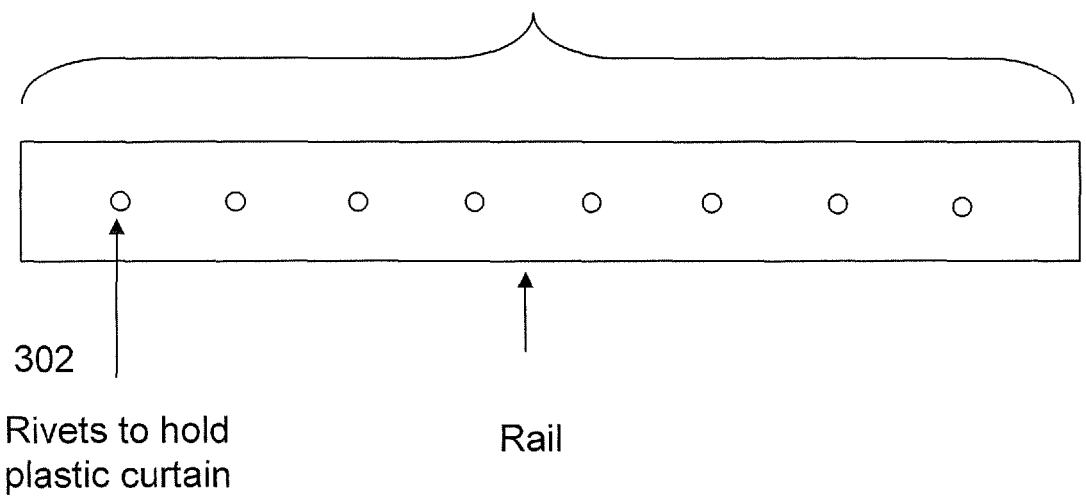
FIG. 3 illustrates an exemplary embodiment of a rail which can be utilized to hold a thermal curtain and connect the thermal curtain to a drop ceiling grid.

Referring now also to FIG. 3, a rail 300 is shown which can be utilized to hold the barriers 118 of the thermal curtain 116 and connect the thermal curtain 116 to the drop ceiling grid 114. The rail 300 features a plurality of rivets 302, which can be utilized to hook the thermal curtain 116 to the rail 300. Although, the present disclosure contemplates using other connection structures. In an embodiment, the spacing of the rivets 302 can be adjusted based on the size of the barriers 118 or for other reasons as well. Additionally, the rail 300 can be configured to come in a variety of different dimensions. For example, in this case, the rail 300 can come in lengths of 3, 6, 9, 12, and 15 feet. Other lengths and/or dimensions of the rail 300 can be utilized depending on the circumstances.

Figure 4:
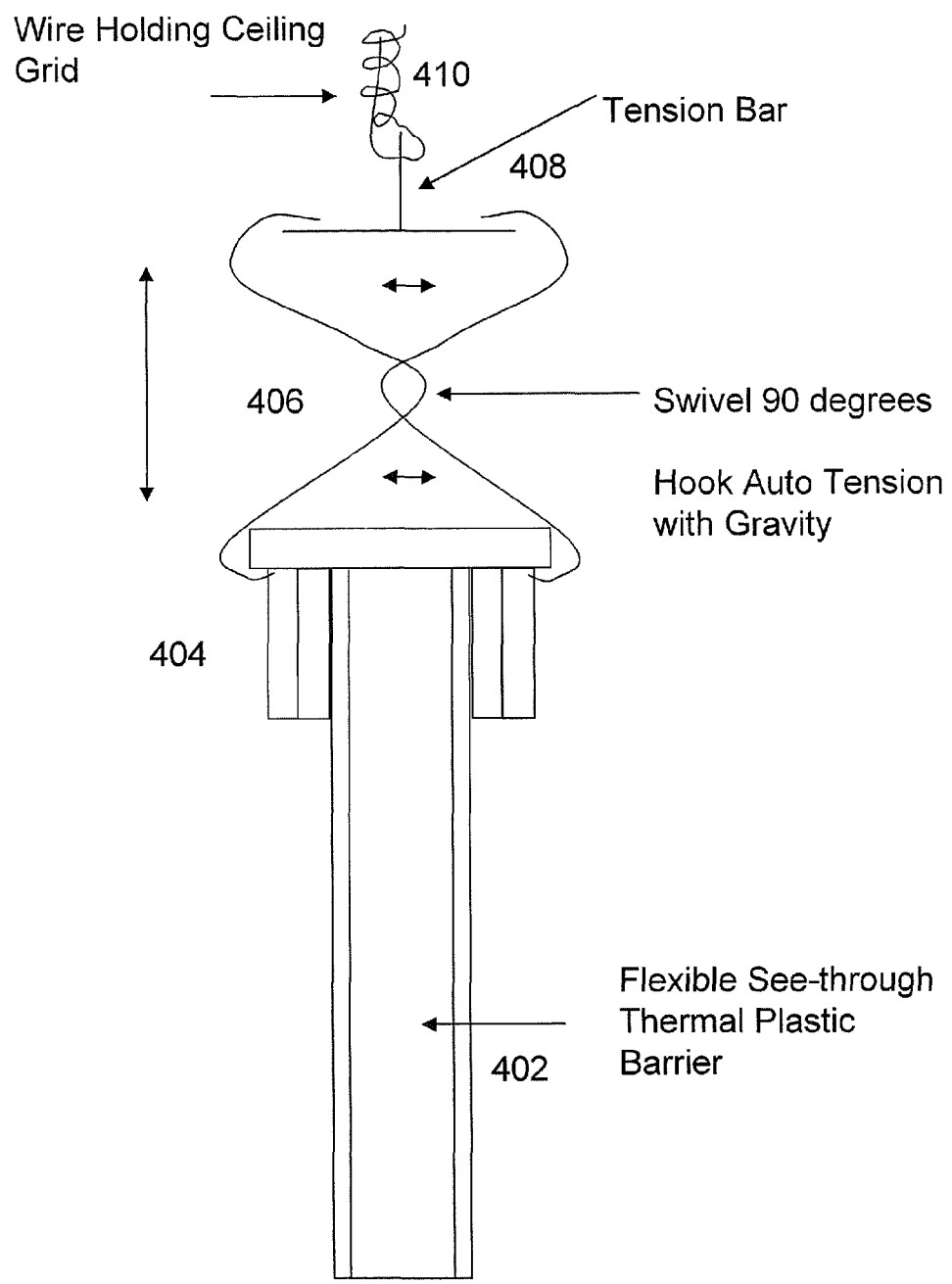
FIG. 4 illustrates an exemplary embodiment of a barrier, which can be rotated and adjusted into various positions by utilizing a hook and swivel mechanism.

Referring now also to FIG. 4, a setup 400 featuring a barrier, which can be rotated and adjusted into various positions by utilizing a hook and swivel mechanism, is illustratively shown. The setup 400 can include a barrier 402, which can be similar to the barrier 118 from FIG. 1 and an end section 404, which can be similar to the end section 200 from FIG. 2. The end section 404 can be configured to hold the barrier 402 in place and can be attached to the ceiling grid via a hook and swivel mechanism 406. The hook and swivel mechanism 406 can be utilized to rotate the barrier 402 in a variety of directions. For example, the swivel mechanism 406 can rotate the barrier 402 in a position 90 degrees from its current position. The swivel mechanism 406 can cause the barrier 402 to be rotated in other degrees and orientations as well. Additionally, the swivel mechanism 406 can be utilized to accommodate the drop ceiling grid 114, which in certain circumstances can be perpendicular or lateral to the cabinets 102.

The hook and swivel mechanism 406 can be connected or otherwise coupled to a tension bar 408. The tension bar 408 can be made of metal or other materials, and can be configured to resist or otherwise withstand tensile strain. A wire 410, which can be configured to hold the drop ceiling grid 114, can be configured to hold the tension bar 408 in place.

Figure 5:
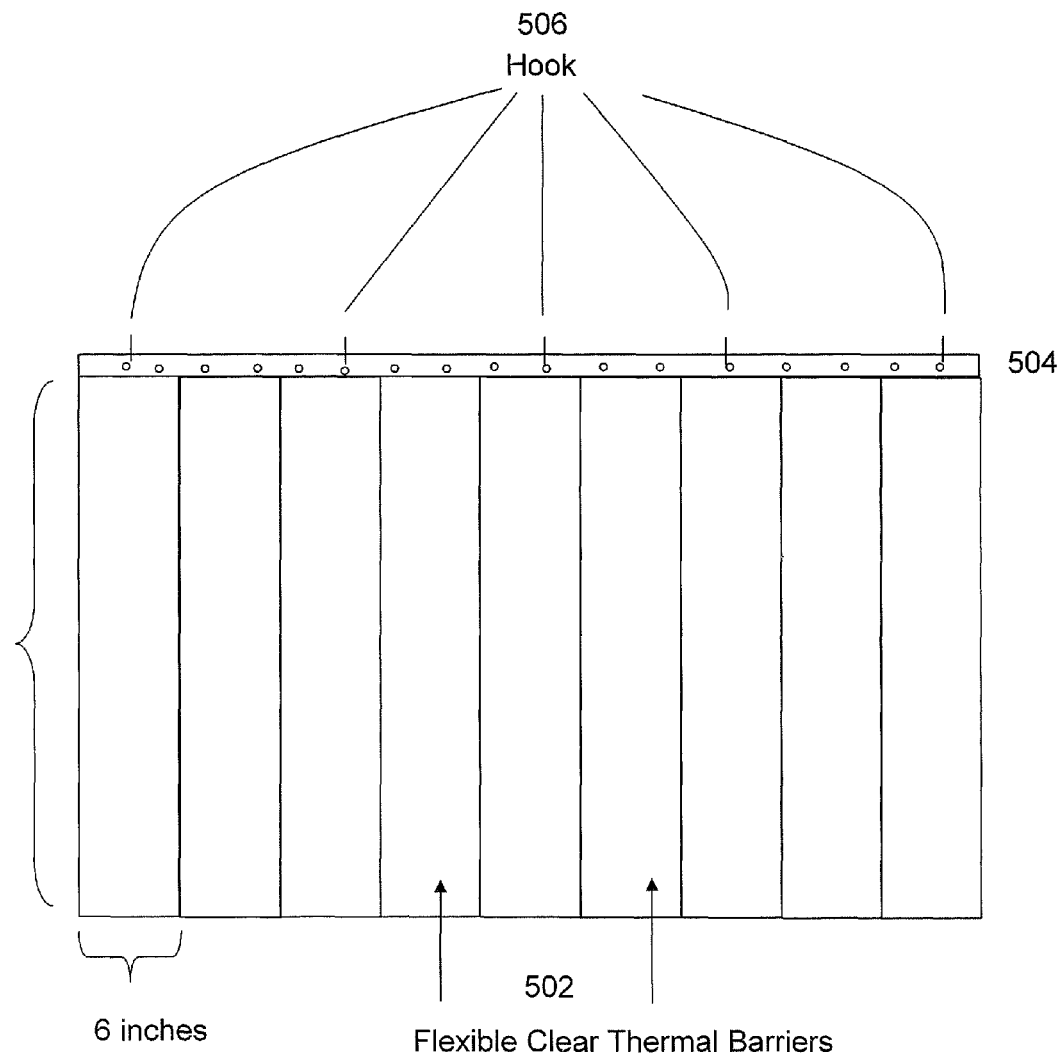
FIG. 5 illustrates an exemplary embodiment of a variable length thermal curtain attached to a rail, which can be connected to a drop ceiling grid.

Referring now also to FIG. 5, a variable length thermal curtain 500 is illustratively shown. The thermal curtain 500 can be similar to thermal curtain 116 and can be comprised of a plurality of flexible barriers 502. The barriers 502 can be six inches wide as shown in FIG. 5, however, other widths can be utilized. The length of the barriers 502 can be variable to allow for different configurations, which can be utilized for devices requiring different environmental conditions. As mentioned above, the barriers 502 can be connected to the drop ceiling grid 114 via a rail 504, by utilizing a hook mechanism 506.

Figure 6:
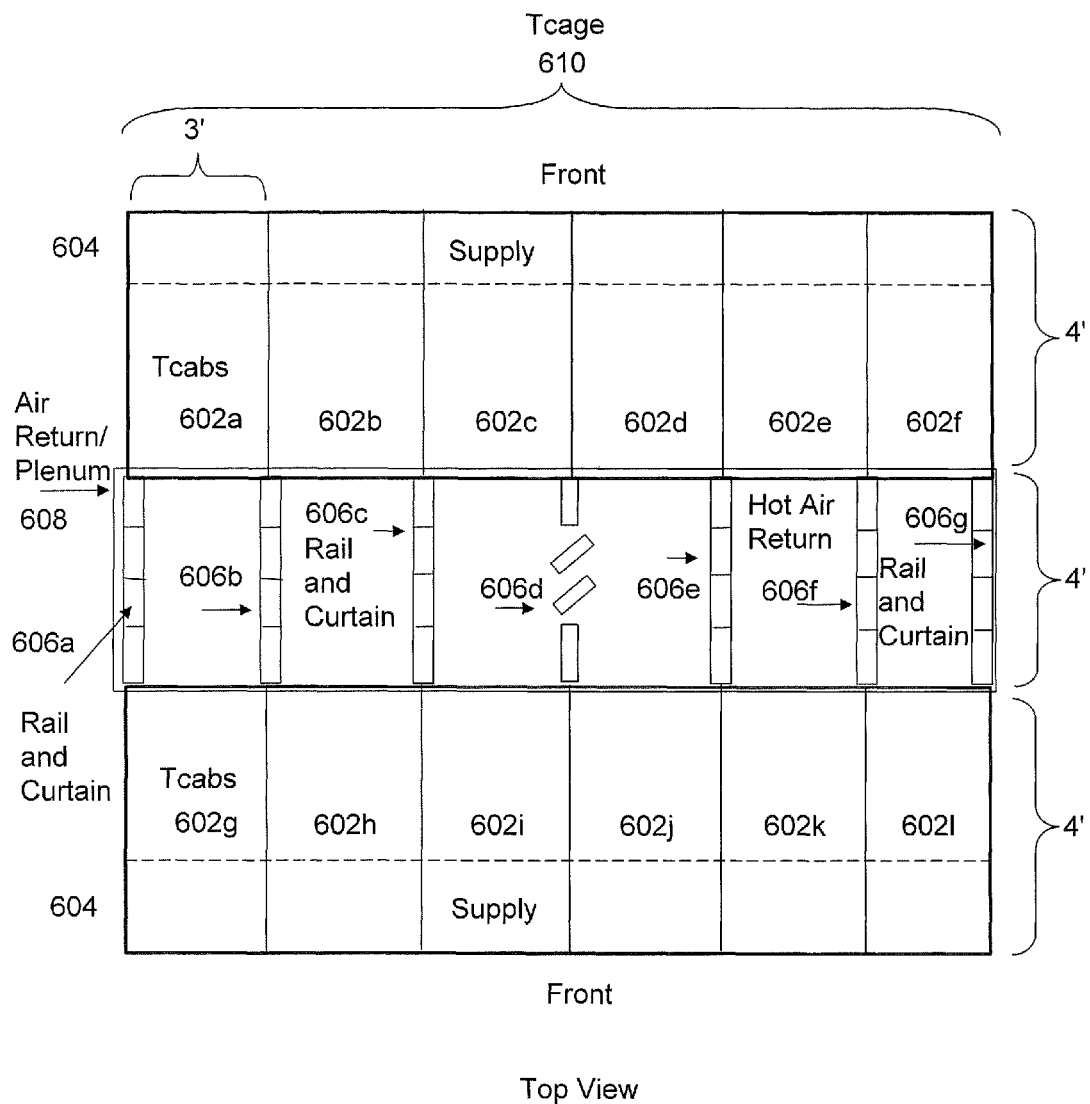
FIG. 6 illustrates a top view of an exemplary embodiment of a thermal management cabinet system, which includes a plurality of rows of thermal cabinets, a series of thermal curtains, and a cooling system.

Referring now also to FIG. 6, a top view of a thermal management cabinet system 600, which includes a plurality of rows of thermal cabinets 602a-1. The thermal cabinets 602a-1 can be arranged in two opposing rows. For example, cabinet 602a faces opposite to cabinet 602g and so forth down the rows. The thermal management system 600 can include air supplies 604, which can be utilized to cool the cabinets 602a-1. As described above, the air supplies 604 can be located within a false floor that lies underneath the cabinets 602a-1. Cool air can be funnelled through openings in proximity to the front of the cabinets 602a-1. The thermal management system 600 can also include a plurality of rails and thermal curtains 606a-g, and an air return/plenum 608. As shown, the rails and thermal curtains 606a-g can be positioned between pairs of cabinets 602a-1. For example, rail and curtain 606a can be placed between cabinets 602a and 602g.

Additionally, the thermal curtains 606a-g can be adjusted in a variety of positions. For example, a pair of barriers in thermal curtain 606d are illustrated as having been adjusted as to orientation so as to account for one or more environmental conditions. The thermal curtains 606a-g can be utilized to direct hot air generated from the electronic equipment residing in the cabinets to the plenum 608. The plenum 608 can then proceed to direct the hot air to a cooling coil or other cooling mechanism (not explicitly shown) for cooling. The cooled air can then be fed through the air supplies 604 to the cabinets 602a-1 to cool the electronic equipment housed in the cabinets 602a-1. Notably, the various components and structures in the thermal management system 600 can be housed within a movable thermal cage 610, which can be much like thermal cage 122.

Operatively, the thermal management system 100 can be configured to control and/or regulate environmental conditions affecting and/or associated with electronic equipment housed in the cabinets 102 or other similar structures. Air can be utilized to regulate the environmental conditions affecting the electronic equipment. The plenums 110 in the raised floor system 108 and/or the drop ceiling grid 114 can utilize one or more pressure sources, which can create a pressure differential through the housing of the cabinets 102 to cause air to flow through the cabinets 102 and across the electronic equipment. As the air flows across the electronic equipment, the electronic equipment can cause the temperature of the air to be increased.

The thermal management system 100 can include a controller (not explicitly shown) for controlling the environmental conditions. The controller can be a processor, computing device, or other device capable of receiving and/or monitoring data associated with the environmental conditions. In an embodiment, the controller can receive the data from one or more types of sensors. Such sensors can include pressure, humidity, and/or temperature sensors. Of course, other types of sensors can also be utilized. The controller can analyze the data, and if it determines that the environmental conditions are undesirable, it can proceed to adjust the conditions. For example, if the pressure data is outside the proper desired range, the controller can cause one or more devices in the system 100 to adjust the pressure in the system 100 so that the pressure falls or rises into the desired range.

As the air flows across the electronic equipment, the air can be directed away from the cabinets 102 to the drop ceiling grid 114 by utilizing the thermal curtain 116. In an embodiment, the adjustable barriers 118 of the thermal curtain 116 can direct the air in a variety of different paths based on the current position of the barriers 118 to at least one exhaust channel associated with the cabinets 102. The exhaust channels can be in proximity to the vented back doors 106 of the cabinets 102. For example, referring now again to FIG. 6, the barriers in thermal curtain 606d can direct air differently than the barriers in thermal curtain 606a. Once the air has entered the drop ceiling grid 114, the heated air can flow through the drop ceiling grid 114 via the one or more plenums 110. The plenums 110 can direct air to the raised floor system 108 or to another similar system so that the air may be cooled by cooling coils or other cooling mechanisms.

For air that has been directed to the raised floor system 108, a cooling coil (not explicitly shown) in the raised floor system 108 can cool the air as the air flows across the cooling coil. The plenums 110 in the raised floor system can utilize pressure sources, including fans, to cause a pressure differential that can cause the air to flow via one or more supply channels to the openings/inlets 112 of the cabinets 102. The cooled air can then flow across the electronic equipment in the cabinets 102 so as to regulate the environmental conditions affecting the electronic equipment. Once the air flows across the equipment, the air is heated and the process continues as described above. Accordingly, this process can be a continuous process, which can be adjusted by the controller based on the environmental conditions existing in the environment. The air flow can be generated and controlled using various mechanisms and techniques, which are contemplates by the present disclosure including the use of fans, adjustable baffles, and so forth.

Figure 7:
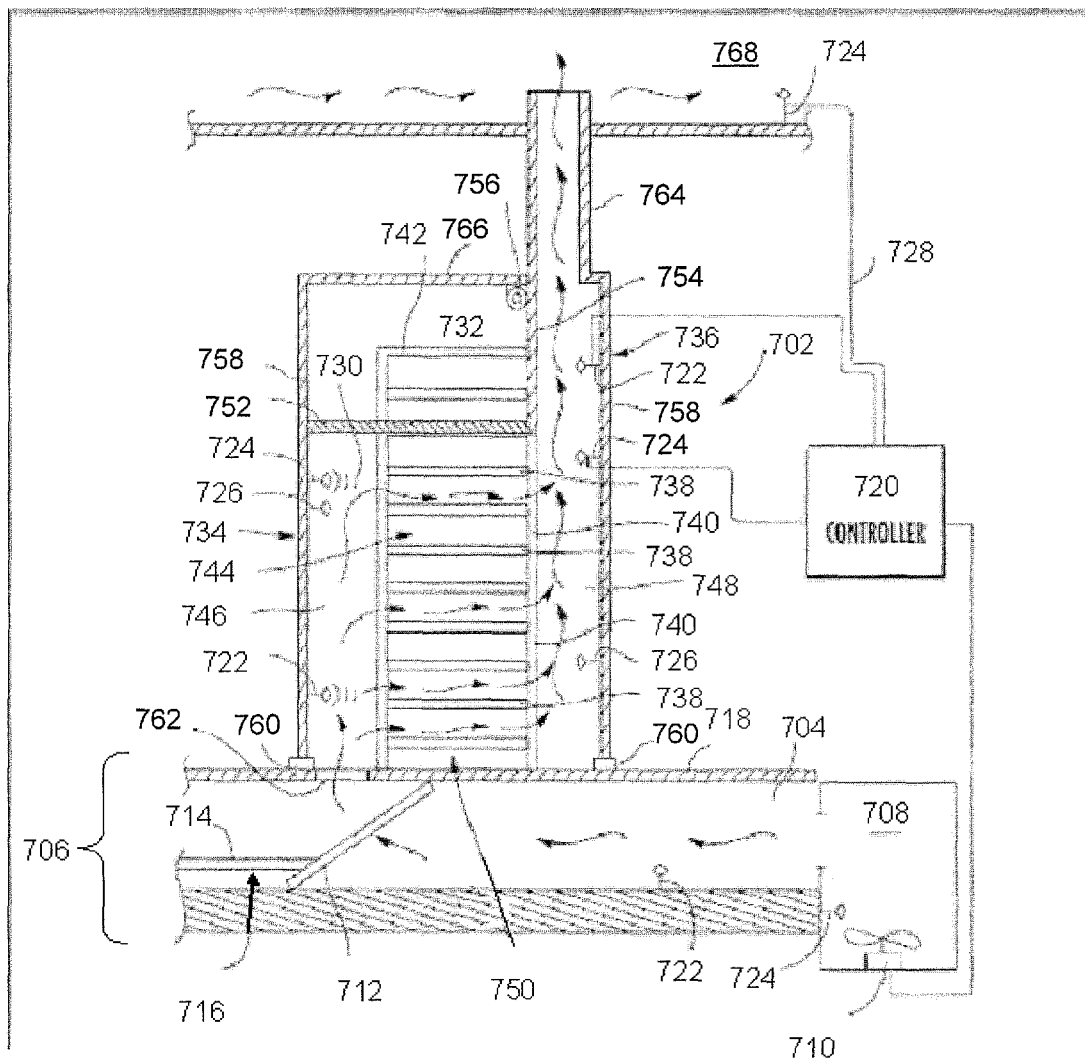
FIG. 7 illustrates a side view of an exemplary embodiment of a thermal management cabinet system with sample airflow patterns.

Other embodiments for providing thermal management can be provided as well. Referring now also to FIG. 7, a side view of a thermal management cabinet system 700, which according to an embodiment, illustrates sample airflow patterns, is shown. The thermal management system 700 can include a cabinet 702, which can be utilized to house electronic equipment or other types of equipment, much like the cabinets 102 described above. The cabinet 702 can be configured to store computing devices, servers, storage devices, and other similar devices. In an embodiment, the management system 700 can include multiple cabinets 702 and is not, therefore, limited to having one cabinet 702. The multiple cabinets 702 can be arranged in a plurality of rows, although other arrangements are contemplated by the present invention.

For example, the cabinets 702 can be arranged in an annular configuration (e.g., concentric rows). The particular configuration of the rows can be selected based on a number of factors, including facilitating adjustment of environmental conditions associated with the cabinets 702 and/or maximizing efficient use of limited facility space. In an embodiment, each row can have varying environmental conditions associated with it. For example, one row of cabinets 702 can be utilized to house servers that may require a large amount of cooling in comparison to a second row of cabinets 702, which can house other types of devices which may require less cooling. Grouping the rows according to environmental conditions and/or requirements, such as grouping the rows based on temperature and humidity range, system 700 can more efficiently control the environments since devices requiring similar conditions are grouped accordingly.

In another embodiment, rows of cabinets 702 can be organized based on the amount of cooling that a particular row needs. For example, cabinets 702 that need the least amount of cooling can be positioned far away from the cooling source, whereas cabinets 702 needing the greatest amount of cooling can be positioned as close the cooling source as possible. Additionally, multiple configurations for delivering air to the cabinets 702 in the system 700 can exist. For example, the system 700 can include a supply channel 704, which can supply cooled air to multiple cabinets 702 in the system 700. In an embodiment, each cabinet 702 can be directly connected to the supply channel 702 so that each cabinet 702 can receive air that flows directly from a cooling subsystem 706 instead of from another cabinet 702.

In one embodiment, the cabinets 702 can be arranged so that at least a portion of the cabinets 702 receive cooling in series. For example, a first set of cabinets 702 needing a significant amount of cooling can directly receive air that has been cooled by the cooling subsystem 706. This cold air can flow across the electronic equipment of the cabinets 702 and then can be directed towards a second set of cabinets 702 which need lower levels of cooling. After flowing across the first and second set of cabinets 702, the air can then be returned to the cooling subsystem 706 for removal of the heat that has been transferred to the air by the first and second sets of cabinets 702.

The thermal management system 700 can include one or more plenums 708, which can be in fluid communication with the cabinets 702. Notably, the plenums 708 can be pressurized. For example, the system 700 can utilize a plenum 708 so that the pressure differential is centrally generated. In another example, multiple pressurized plenums 708 can be utilized, such as one or more plenums being utilized for each row. The plenum 708 can have one or more pressure sources, such as fan 710, although other pressure sources are also contemplated including pumps and the like. In an embodiment, the fan 710 can be a centrifugal fan and can include noise-absorption components and anti-vibration mounting components. Various filters and other components can be utilized in combination with the fan. In one embodiment, the fan 710 can be an adjustable speed fan to increase or decrease the pressure in the plenum 708. For example, the fan 710 can be a variable frequency drive fan. In another embodiment, a plurality of fans 710 can be in communication with the pressurized plenum 708 so that the pressure can be increased by operating additional fans of the plurality of fans. The present disclosure also contemplates the fan configuration being modular. For instance, the fans 710 can be easily added to the plenums 708, such as by removing a blocking plate that seals a wall of the plenum 708 in the absence of the fan 710.

The cabinets 702 can be bound on a first side by a cold zone and bound on a second side by a hot zone. In an embodiment, the cold and hot zones can have access areas that have doors, which can allow technicians to access the cabinets when needed (such as for adding or removing the electronic equipment). However, the present disclosure also contemplates the cold and hot zones being integrally formed with the cabinets 702 and/or defined by an insulated false wall between the access areas and the cabinets. In an embodiment, each cabinet 702 in a row can share a cold zone and a hot zone. However, the present disclosure contemplates other configurations of cold and hot zones, such as individual cabinets 702 or groups of cabinets 702 in a single row having their own cold and hot zones. Adjacent hot and cold zones can be separated by a wall.

The pressurized plenum 708 can generate a pressure differential between a cold zone and a hot zone, thereby causing air to flow across the electronic equipment in the cabinets 702 which removes heat from the equipment. The number and configuration of plenums 708 that are utilized to generate the desired pressure differential can vary based on a number of factors, including the type of electronic equipment that is being environmentally managed. For example, a plurality of plenums 708 can be in fluid communication with the cold and hot zones of each row. The pressurized plenums 708 can generate positive pressure and/or negative pressure to create the desired pressure differential and thereby create air flow over the electronic equipment. For instance, a first pressurized plenum can generate a positive pressure (e.g., a desired pressure above ambient) in proximity to the cold zone, while a second pressurized plenum generates a negative pressure (e.g., a vacuum) in proximity to the hot zone.

In one embodiment, the use of pressurized plenums 708 allows system 700 to isolate fans 710 from the electronic equipment. For example, the pressurized plenums 708 can increase air pressure using pumps so that the system 700 does not utilize any fans 710. In another example, the pressure increase can result from the use of fans that are positioned remotely from the cabinets 702 so that air flow from the fans does not directly contact the electronic equipment (e.g., the fans create air flow within the plenum 708 that results in an increased pressure in the plenum 708 which is in turn communicated to the cabinets 702). The air passing over the electronic equipment is utilized to remove heat from the equipment. In turn, the cooling subsystem 706 can then remove the heat from the air.

In one embodiment, the cooling subsystem 706 can be a vapor-compression cycle system, although other systems are also contemplated by the present disclosure. The subsystem 706 can include a pump and one or more chillers for cooling water or other coolant (e.g., chilled liquid settings between 15 and 50 degrees Fahrenheit) which is then supplied to coils 712 via supply lines 714 and return lines 716. The coils 712 can be positioned in thermal communication with the hot zone. For example, the coil 712 can be positioned under the floor 718 so that the air coming from hot zone passes through the coil 712, then through the pressurized plenum 708 and back into the cold zone. The particular number and configuration of coils 712 that are utilized can vary based on a number of factors, including the number of pressurized plenums 708 and configuration of the cold and hot zones that are being utilized. For example, each row of cabinets 702 can have six equidistantly positioned pressurized plenums 708 under the floor 718 with a coil 712 in thermal communication with each of the plenums (e.g., positioned downstream of the hot zone and upstream of the cold zone for each plenum).

To control the environment surrounding the electronic equipment, a controller 720 can be utilized. The controller 720 can be a machine within which a set of instructions, when executed, may cause the machine to perform any one or more of the methodologies discussed herein. In some embodiments, the machine can operate as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein. The exemplary embodiment described herein can utilize various power sources, including backup generators and the like. In one embodiment, solar energy can be utilized as a power source. The power can be based on various voltage sources and can include a medium voltage supply as well as a 480 v supply.

The controller 720 can be in communication with one or more sensors for receiving environmental information associated with the electronic equipment. For example, one or more temperature sensors 722 and one or more pressure sensors 724 can be positioned with respect to the electronic equipment so that the sensors can capture environmental information and transmit the information to the controller 720. The particular positioning of the sensors can vary. For instance, temperature sensors 722 can be placed both upstream and downstream of the coil 712 so that the cooling efficiency of the coil 712 can be easily monitored, while other temperature sensors 722 can be placed in close proximity to the electronic equipment so that the amount of heat being generated by the electronic equipment can be more easily monitored. The pressure sensors 724 can be placed both upstream and downstream of the pressurized plenum 708 so that the pressure differential can be more easily monitored. The type of sensor used to capture the environmental information can also vary, including pressure and temperature transducers and thermocouples.

In one embodiment, other sensors can also be used to further monitor the environmental conditions associated with the electronic equipment, such as humidity sensors 726 and flow sensors (not explicitly shown). The humidity sensors 726 allow the controller 720 to monitor the humidity that the electronic equipment is being exposed to and to adjust the humidity accordingly, such as through use of a de-humidifier that is in fluid communication with the electronic equipment. The flow sensors can allow the controller 720 to monitor the flow rate of air, such as for determining heat transfer via convection. The use of flow sensors can also be used for determining other environmental characteristics, such as air flow turbulence, that can have an adverse impact on the cooling of the electronic equipment or the equipment itself. The sensors can communicate with the controller 720 via hardwire (e.g., cables 728) and/or wireless links 730. The particular communication protocols that are utilized can vary and can include Wireless Fidelity or WiFi services, Bluetooth, GSM, CDMA, UMTS, WiMAX, and so forth. A combination of communication techniques can also be utilized, such as allowing the sensors to communicate both wirelessly and via hardwire to provide redundancy so that data is not lost in the event of a link failure.

Notably, the controller 720 can receive the environmental information from the sensors and adjust the environmental conditions accordingly. In one embodiment, each of the cabinets 702 can have a range of environmental conditions that are acceptable. In real time, the controller 720 can receive the environmental information associated with each of the cabinets 702, and then in real time can adjust one or more of the temperature, pressure and humidity associated with the cabinets 702. For example, the controller 720 can determine that a first cabinet 702 needs to lower its temperature by a desired amount. The controller 720 can then transmit control signals for making the appropriate adjustment to achieve the desired temperature change. For instance, the controller 720 can transmit a control signal to the cooling subsystem 706 to increase coolant flow to the coil 712 that is associated with the particular cabinet 702 or to decrease the temperature of the coolant that is being provided to the coil 712. In one embodiment, the controller 720 can transmit a control signal to the cooling subsystem 706, which designated a desired temperature, and the subsystem 706 can then implement the necessary steps to achieve the desired temperature.

As another example, the controller 720 can transmit a control signal to the pressurized plenum 708 that is associated with the particular cabinet 702 so that the pressure differential is increased thereby increasing the air flow through the particular cabinet 702. In one embodiment, the controller 720 can independently utilize the pressurized plenum 708 and the cooling subsystem 706 to adjust the temperature associated with a particular cabinet 702. In another embodiment, the controller 720 can utilize both of the pressurized plenum 708 and the cooling subsystem 706 to adjust the temperature associated with a particular cabinet. As another example, the controller 720 can determine that a first cabinet 702 needs to decrease its air flow rate through the cabinet 702 by a desired amount. The controller 720 can then transmit control signals for making the appropriate adjustment to achieve the desired air flow rate. For instance, the controller 720 can transmit a control signal to the pressure source 710 of the pressurized plenum 708 to decrease the pressure within the plenum 708 that is associated with the particular cabinet 702.

In one embodiment, a damper can be utilized for air flow control. For instance, the damper can be positioned downstream of the pressurized plenum 708 and opened or closed using an actuator (e.g., a servo-motor or other movable control device). In this example, the controller 720 can restrict air flow to the particular cabinet 702 by sending control signals to the actuator which results in the damper moving towards a closed position. The controller 720 can also utilize historical information to provide environmental management for the cabinets 702. For example, the controller 720 can monitor the temperature of particular cabinets 702 based on particular times of the day and adjust the environmental conditions of the cabinets 702 in anticipation of those temperatures. For instance, historical data may show that electronic equipment in a particular cabinet 702 is typically being used to capacity during the morning with a resulting elevation of cabinet temperature during those morning hours. The controller 720 can adjust the temperature in the particular cabinet 702 to a lower portion of the desired range in anticipation of the increased temperature in the morning. The historical data can be maintained in a memory of the controller 720 or can be stored elsewhere and retrieved by the controller 720.

Additionally, in an embodiment, the controller 720 can also maintain historical information associated with the efficiency of the thermal control being implemented by the controller 720. For example, the controller 720 can implement several different techniques for achieving a desired environmental condition and compare the techniques to determine which was the most efficient. For instance, where a temperature decrease is needed, the controller 720 can on a first occasion utilize an increase in pressure differential to achieve the lower temperature. On a second occasion, the controller 720 can utilize the cooling subsystem 706 to achieve the lower temperature. The controller 720 can then determine efficiency based on such factors as the amount of time needed to achieve the lower temperature, the amount of power utilized in achieving the lower temperature and so forth. In this example, the controller 720 can then utilize this historical information to determine which thermal management techniques should be utilized in the future based on the particular circumstances.

In one embodiment, other factors can also be analyzed by the controller 720 for determining the particular technique to utilize to achieve the desired environmental condition. For instance, vibration or noise can be monitored with respect to the use of certain components of the system 700 and the amount of vibration or noise can be a factor in determining which technique (e.g., which cooling components) should be utilized. In another embodiment, blowers can be housed in plenums 708 for providing a pressure differential to the computer devices, such as racks. The blowers can engage with channels so that the blowers can be slid or otherwise positioned in fluid communication with the racks. For example, the channels can guide a blower housing, such as along roller bearings, so that the housing can travel into a desired position. The channels can be of various types, including U-shaped channels. In this example, the blower housing provides for a modular relationship with the racks so that blowers can be easily added as the number of racks is increased, removed as the number of racks decreases, or accessed for repair or the like.

In one embodiment, the racks can be positioned above the blowers and a controllable damper can be utilized. In another embodiment, air flow can be more closely controlled through use of a first controllable damper, such as motorized cone damper, and a second damper, such as motorized damper. The controllable dampers can be of various types including extruded aluminum dampers having opposed or parallel airfoil blades, such as CD40 or CD504 Extruded Aluminum Dampers manufactured by Ruskin®. In one embodiment, the dampers utilize four inch wide airfoil blades that pivot between open and closed positions within a square frame. Cooling coils, such as coil 712, can be placed in the air flow path of the blowers and drain pans or other water collection devices can be placed under the coils. In one embodiment, the drain pans can have leak detectors connected thereto. A dehumidifier, such as an ultrasonic dehumidifier, can be placed in fluid communication with the racks. The coils and/or dehumidifier can be connected with a water chilled loop system.

In another embodiment, the cabinets 702 can have generally solid side walls 732, a front 734 and a back 736. The cabinet 702 may be used to house a plurality of servers or other pieces of electronic equipment, including routers, DSLAM's and so forth. Suitable dimensions for the cabinet 702 can vary depending on a number of factors including the type of electronic equipment, the facility space available, and the thermal management resources (e.g., the insulation factors, cooling power and so forth) but can include a height of 7 feet, a width of 3 feet and a depth of 4 feet. Additionally, the cabinet 702 may include generally L-shaped horizontal rails 738 attached to, and supported by, four vertical rail supports 740 which form part of a frame 742 that is positioned in the interior of the cabinet 702. A plurality of rails 738 may be provided in pairs to form shelving brackets on which electronic components can be supported. The rails may have any suitable formation, one suitable formation being standard square hole rails that may be positioned 19" apart to form a 19" rack. The rails may be mounted to the vertical rail supports 740 and define the depth of the racks for housing the electronic components.

The vertical rail supports 740 and the rails 738 can define an electronic component storage area 744 that is located within the frame 742. The positioning of the frame 742 can define a front service area 746 forward of the frame to the front 734 of the cabinet, a rear service area 748 rearward of the frame to the back 736 of the cabinet 702. Two side service areas 750 can be defined to the sides of the frame 742. The cabinet 702 can be designed to be 42 U in height, with "U," or rack unit, being a unit of measure used to describe the height of equipment intended for mounting in a 19-inch rack or a 23-inch rack (the dimension referring to the width of rack). One rack unit can be 1.75" (44.45 mm) high. Thus, a suitable number of rails 738 can be provided to equal the desired height of the cabinet 702, with the rails 738 being spaced a suitable number of rack units apart.

An insulated thermal management plate 752 can be provided, which can be moved within the cabinet 702. The thermal management plate 752 can be formed of any suitable material. In one arrangement, the plate 752 can be formed of ABS plastic with a foam insulation backing. The thermal management plate 752 can extend from the front 734 of the cabinet 702 towards the back 736, typically to the rear vertical rail support 740 which marks the front end of the rear service area 748. The electronic components to be housed within the cabinet 702 can be stored within the cabinet 702, such as starting from the lowest rack and working upwards. The thermal management plate 752 is easily movable within the cabinet and is typically placed within the cabinet 702 just above the height of the highest electronic component that is stored within the cabinet 702. The plate 752 may be attached to the rails 738 that are positioned directly above the top-most electronic component, or may simply be rested thereon. At the front edge of the thermal management plate 752, the corners may be chamfered or cut off.

An insulated thermal curtain 754 can be provided at the back 16 of the cabinet 10. The thermal curtain 754 is preferably made of a composite material, though can be formed of any suitable material. The curtain 754 can be suspended from a deployment device 756, such as a spring loaded or ratcheted roller mechanism that is attached at the top of the frame 742. The curtain 754 can either be mounted within or adjacent to the rear rail supports 740 such that it is located at the edge of the rear service area 748. A bottom bracket can enable the curtain 754 to be easily raised and lowered. Typically, the curtain is lowered until it is level with the thermal management plate 752. The curtain 754 can be formed of a thermal insulating material that prevents heat transfer. U-markings 30 may be provided on the curtain at 1.75" intervals, along with a company logo for the cabinet manufacturer. With a 19" rack width, the curtain 754 can be 20" wide.

The curtain 754 can run in, or otherwise be guided by, vertical U-shaped rails attached to the vertical rail supports 740 such that the curtain 754 provides a generally sealed barrier to the transport of air. It should be appreciated, that although the arrangement has curtain 754 provided at the back 736 of the cabinet 702, it may alternatively or in addition be provided at the sides of the cabinet, and/or at only one of the front 734, back 736 or sides of the cabinet 702. In other arrangements, the thermal curtain 754 can be positioned at the front 734 of the cabinet 702. The thermal management plate 752 and the thermal curtain 754 can be used to separate the interior space of the cabinet 702 into different zones by forming baffles to the air flow and heat transfer. A cold zone can be defined within the front service area 746, bounded at the rear by the electronic components that are stored within the racks, and at the top by the thermal management plate 752.

The front door, the sides 732 and the bottom of the cabinet 702 can form the other boundaries of the cold zone. A hot zone can be defined within the rear service area 748, bounded at the front by the electronic components that are stored within the racks and by the thermal curtain 754 that extends from the top of the cabinet 702 to the thermal management plate 752. The sides 732, the rear door, the bottom and the top of the cabinet 702 can form the other boundaries of the hot zone. A neutral heat zone can be formed above the cold zone, defined between the top of the cabinet 702, the thermal management plate 752, the sides 732 of the cabinet, the front door of the cabinet 702 and the thermal curtain 754. Thus, the hot zone typically forms the entire volume of the rear service area 748, while the front service area 746 and the electronic component storage area 744 can be split vertically by the horizontally-oriented plate 752 into the neutral heat zone at the top and the cold zone at the bottom.

Air flow within the cabinet can go first from the cold zone rearward through the electronic component storage area 744 where it becomes heated due to contact with the electronic components therein and exits into the hot zone. The air can then flow vertically upwards within the hot zone to exit the cabinet. The neutral zone is designed to be cut off from this air flow by the thermal management plate 752 and the thermal curtain 754. The neutral zone formed above the thermal management plate 752 can be used for storage for equipment such as laptops or other devices. In other arrangements, a thermal curtain 754 may be provided without provision of a thermal management plate 752, in which case the thermal curtain may be positioned to either the front or back of the storage area 744, or at any location therebetween such as at the center thereof. The thermal curtain 754 can be mounted to the top of the cabinet, and can be simply extended downwardly until it reaches the top-most electronic component stored in the storage area 744. This arrangement thus splits the interior of the cabinet 702 into a hot zone and a cold zone by vertically dividing the space using the thermal curtain 754. In one embodiment, one or more cable trays or other structural guides can be provided for facilitating positioning of cables within the cabinet 702.

The system 700 can further include one or more power distribution units (PDU's). The PDU can include main and distribution circuit breakers as well as various power regulation components, including 300 KVA transformers and multi-pole panelboards. In yet other arrangements, the thermal management plate 752 can extend from the front 734 of the cabinet 702 to the front vertical rail supports 740, and the thermal curtain 754 can be provided close to the front vertical rail supports 740. This creates a smaller neutral heat zone but still performs the function of preventing the cold zone from extending the full height of the cabinet 702 when the electronic components are not necessarily stacked up to the top of the cabinet 702.

Moreover, adjacent to the vertical rail supports 740 at the front 734 and back 736 of the cabinet 702, a plurality of air management fingers and/or brushes (not explicitly shown) can be provided, which can extend to the sides or front/back of the cabinet 702. The fingers can be formed of a non-thermally conductive flexible material, such as a foam, rubber or plastic material. The fingers can be generally rectangularly shaped and can be attached at one end only to a support which is attached the rail supports 740. Each finger can be separately moveable, and can allow cables to be passed therethrough by pushing the cables in between adjacent fingers. The brushes can be similarly arranged, attached at one end only to the rail supports 740. In another embodiment, the brushes can be provided on supports on either side of the gap between the rail supports 740 and the sides/front/back of the cabinet such that the brushes meet in the middle.

In one arrangement, a set of fingers can extend from the rail supports 740 to the sides 732 of the cabinet at the rear edge of the front service area 746. A set of brushes can extend from the rail supports 740 to the rear 736 of the cabinet 702. The side service areas 750 can thus be defined by the fingers and brushes, such that they are bounded at the front by the fingers, at the sides by the sides 732 of the cabinet at the sides of the electronic components stored in the storage area 744 and the brushes, and at the rear by the rear 736 of the cabinet 702. The side service areas 750 can thus be generally separated from the airflow in the cabinet by the fingers and/or brushes, which form baffles, and the side service areas 750 thus form secondary neutral heat zones. It will of course be appreciated that any arrangement of brushes and/or fingers can be employed to both provide a separation of the air flow from the side service areas 750 and still to allow cables to be threaded into and through the side service areas 750 for appropriate cable management purposes.

In another arrangement, in place of or in addition to fingers and/or brushes, flexible foam insulation pieces can be used. The foam pieces may be provided in two parts: a generally thin rectangular piece may be extended vertically from the cut corners of the thermal management plate 752, and a generally triangular-section piece may be attached to a door 758 of the cabinet. When the door 758 is closed, the two foam pieces and can abut one another. Cables can then be run from the electronic components stored on the rack through the abutting foam pieces to the side service areas 750. The foam insulation pieces can thus form baffles between the cold zone and the neutral heat zone of the side service areas 750. However, it should be understood that other insulating techniques and structures can be used, including other insulation means in place of the foam pieces.

The sides 732 may each include one or more removable side panels to allow access between cabinets. The sides 732 and side panels may be constructed of lightweight composite materials with non thermal conductive properties. Insulation may also be provided on the side panels. In some arrangements, the sides 732 may include one or more punch out panels so that cables may be run from servers stored in one cabinet 702 to servers stored in another cabinet 702. As the side service areas 750 are generally neutral air zones, it does not affect the cooling capabilities of the cabinet airflow to provide punch out holes in the sides. The back 736 and the front 734 may both include one or more doors 758. The door 758 may have a side hinge, and may be constructed of lightweight composite materials similar to the sides 732, and may also be insulated. In one embodiment, a double door may be provided, which has the advantage of allowing a decrease in necessary aisle space between cabinets that face one another. The door may include a temperature sensor that may be viewed without opening the door. The temperature sensor may be provided behind a window in the door, or may have a sensor part mounted inside the cabinet and a display part mounted on the outside of the door. The door may include a combination lock, or other locking mechanism. A rubber or other seal (not shown) may be provided around the doors 758, to help to seal any air gaps that might be created.

The cabinet 702 may be mounted on a modular base 760, forming a bottom of the cabinet 702. The base may measure 3' wide by 4' long, and may allow access to a raised floor system 706 such as a TATE 24"×24" modular access floor system. A front section 762 of the base 760 is open to the subfloor, and registers with corresponding openings that are created to the raised floor system. A plurality of feet can be provided to bear the weight of the cabinet. A skirt (not shown) may surround the feet to prevent cool air from exiting around the base 760. An airflow duct or chimney 764 may extend from a top 766 of the cabinet 702. It should be understood by one of ordinary skill in the art that the chimney can be removed from the embodiment such that the hot air flows directly into the room such as through a perforated back of the cabinet (not shown). The duct 764 can extend generally from an area of the top 766 that is adjacent to the back 16 of the cabinet. The duct 764 is dimensioned to extend into a ceiling space 768 such as an above-ceiling plenum for venting hot air to a venting means (not shown).

The duct 764 may be flexible so that it can be easily connected to the ceiling even in the event of imperfect positioning of the cabinet 702 below a vent panel into the ceiling space 768. In one arrangement, the duct 764 can be formed of a flexible fabric or plastic material. In another embodiment, the duct 764 can be formed of a rigid material. The ceiling space 768 may be a standard drop ceiling system. Various components can be provided in the top 766, such as a power raceway and a public communications raceway, both of which may be open to the room. A divider may divide the public communications raceway for fiber and copper cables. A patch panel can extend from the public communications raceway into a private communications raceway for pass through of cables into the interior of the cabinet 702. Dividers may be included in the private communications raceway for dividing the space for fiber and copper cables. Junction boxes may be provided in the power raceway for supply of power to the power circuit in the cabinet. Power strips and cable managers may be provided adjacent the back 736 of the cabinet 702. It will be appreciated that the arrangement of components at the top 766 of the cabinet 702 can be varied to suit the particular application.

In use, the cabinet 702 can be installed over a raised access floor 706 that is provided with cooled air from an HVAC or other system. The base 760 can be registered with openings in the floor 718. The chimney can be extended into a drop ceiling 768. The electronic components can be installed on rails 738, and are appropriately cabled by passing cables through the foam pieces, fingers and/or brushes into the side service areas 750. Standard cable management ladders may be employed in the side service areas 750 to hold the cables at the right height and to allow them to be passed to the tops of the cabinet. The cables are run to the top of the cabinet 702 for connection to the power supply and to communications cables, which may be connected to other servers using standard overhead ladder racks. The doors 758 are then closed.

As the electronic components are operated, they generate heat which is forced to the rear service area 748 by the airflow coming into the cold zone of the front service area 746 of the cabinet via the aperture 762 at the front of the cabinet 702. The hot zone created in the rear service area 748 due to the heating effect of the electronic components causes the air to flow up through the duct 764. The air thus circulates from the cold zone, through the electronic components in the storage area 744 to the hot zone and up into duct 764. The various baffles such as the thermal management plate 752, thermal curtain 754 and foam pieces, fingers and/or brushes constrain the airflow into the smallest possible space within the cabinet, and prevent hot and cold air mixing other than through the electronic component storage area 744. In one embodiment, the plate 752 is not utilized with the cabinet. In order to ensure that sufficient cool air is delivered to the upper most electronic components, one or more flow diverters can optionally be used. For example, a perforated curtain or a series of plates, may be used. Such arrangements can help to keep cool air flowing towards the top servers rather than allowing it all to be directed to the lower servers.

In one exemplary embodiment, the cabinet enclosure can have an inlet and an outlet in proximity to a bottom portion of the cabinet enclosure. A supply channel can be connected with the cabinet enclosure inlet. The cabinet enclosure can be positioned on a floor and the supply channel can be under the floor. An exhaust channel can be connected with the cabinet enclosure outlet. One or more plenums can be in fluid communication with at least one of the supply and exhaust channels. The plenums can have a pressure source for generating a pressure differential through the enclosure of the cabinet enclosure causing air to flow therethrough. A cooling coil can be positioned under the floor and in thermal contact with the supply channel. A coolant can flow through the cooling coil to remove heat from the air flowing through the supply channel.

In one exemplary embodiment, a thermal management cabinet for electronic equipment can include a cabinet frame having side walls and defining a front, a back, a top and a bottom, where the cabinet Rains a generally sealed enclosure for electronic equipment. An electronic component storage area including at least one shelving rack for supporting electronic equipment can be defined in an interior section of the cabinet. At least one opening can be included in the top of the cabinet, and at least one opening can be included in the bottom of the cabinet. The cabinet can be dimensioned to extend between a raised access floor of a building and a drop ceiling of a building, where the access floor carries cooled air and the drop ceiling venting heated air. The bottom opening of the cabinet can be alignable with an opening in the access floor such that cool air from the access floor passes into the cabinet and flows through the electronic component storage area to exit the cabinet through the top opening, which is alignable with an opening in the drop ceiling.

The cabinet interior can be separated into temperature zones comprising at least a cold zone supplied with air from the bottom opening of the cabinet and a hot zone for venting through the top opening, with at least one baffle provided to create the temperature zones such that air is directed to flow from the cold zone through the electronic component storage area to the hot zone. In one arrangement, the baffle can comprise a thermal management plate that is positioned horizontally in the cabinet above the electronic component storage area. The thermal management plate can be formed of insulated material such as a plastic material backed with an insulator. In another arrangement, the baffle can comprise a heat transfer curtain that is positioned vertically in the cabinet above the electronic component storage area. The heat transfer curtain can be formed of a composite material. In yet another arrangement, the baffle can be flexible and can allow cables to be passed through areas of the cabinet while providing a heat transfer barrier. The flexible baffle can comprise at least one of flexible fingers, foam insulation and brushes. The flexible fingers and brushes can extend from the electronic component storage area to at least one of the side walls, front and back of the cabinet. The at least one foam insulation can comprise two flexible foam pieces positioned to allow cables to be passed therebetween.

In another embodiment, a duct can extend from the top opening of the cabinet for connection to a drop ceiling. The duct can be formed of a flexible material such as a fabric material. At least one door can be provided in at least one of the front and back of the cabinet. The at least one door can be a double door. Insulation pieces can be provided adjacent at least one hinged edge of the at least one door. The insulation pieces can form a flexible baffle, and can comprise two flexible foam pieces positioned to allow cables to be passed therebetween. At least one side of the cabinet can include a removable panel. At least one punch hole having a removable plug can be provided in at least one side of the cabinet. At least one airflow management structure can be provided adjacent to the bottom opening of the cabinet, which may be a perforated curtain. In one embodiment, the system can comprise a plurality of data containers (e.g., 40 feet long) with sixteen cabinets and two PDU's each equaling 144 customer cabinets and three associated 40' power support units.

Notably, features of the thermal management system 700 can be combined or otherwise associated with the other systems described above and/or the methods described below.

Figure 8:
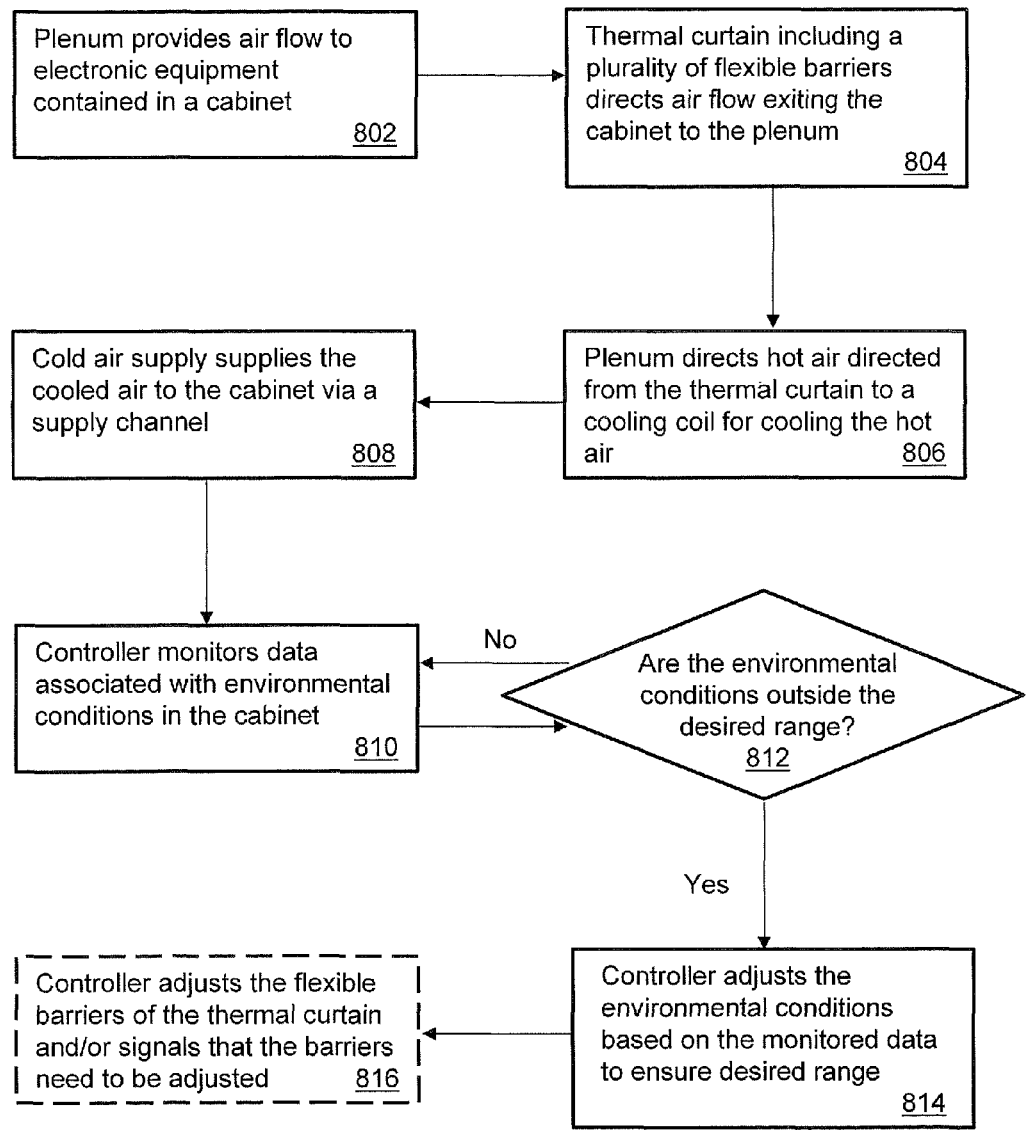
FIG. 8 illustrates an exemplary embodiment of a method for providing thermal management to electronic equipment.

Referring now to FIG. 8, an illustrative method 800 for providing thermal management to electronic equipment, which is operable with the thermal management systems and components of FIGS. 1-7. The method 800 is not intended to be limited to the systems and components described above or illustrated in the drawings. The method 800 can begin with step 802, in which a plenum or other similar device can provide air flow to electronic equipment contained within a cabinet. Notably, the plenum can generate the air flow by utilizing one or more pressure sources, which can create a pressure differential through the housing of the cabinet to cause air to flow through the cabinet and across the electronic equipment. As the air is flowing across the electronic equipment in the cabinet, the air is heated by the electronic equipment and can exit the cabinet via a vented back door, much like as shown in the thermal management system of FIG. 1.

At step 804, the hot air can be directed from the cabinet by a thermal curtain to the plenum via an exhaust channel in fluid communication with the cabinet and the plenum. As noted above, the thermal curtain can be comprised of a plurality of barriers, which form the thermal curtain. The barriers can be flexible and see-through to allow people to walk through the barriers and see cabling or other components associated with the electronic equipment. Additionally, the barriers can be made of plastic or any other similar material which allows for flexibility. Notably, a thermal curtain can be positioned between pairs of opposing cabinets as well, such as found in FIG. 1. This allows the thermal curtain to direct heat and air flow for at least two cabinets at a time. As the air is being directed to the plenum by the thermal curtain via the exhaust channel, the plenum can direct the hot air to a cooling coil at step 806.

The hot air can flow across the cooling coil, which can be utilized to cool the hot air to a desired temperature. At step 808, a cold air supply can supply the cooled air to the cabinet via a supply channel in fluid communication with the air supply and the cabinet. The pressure differential caused by the pressure sources associated with the plenum can cause the cooled air to flow across the electronic equipment so as to regulate the environmental conditions in the cabinet. At step 810, a controller can monitor data associated with the environmental conditions in the cabinet. The controller can be configured to received the data from a plurality of sensors configured to measure and retrieve the data associated with environmental conditions. For example, the sensors can include, but are not limited to including, pressure, temperature, and humidity sensors.

As the controller is monitoring the data associated with the environmental conditions, the controller can determine if the data is outside a desired range at step 812. If the data is in the desired range, the method 800 can go back to step 810 and allow the controller to continue monitoring the data associated with the environmental conditions. If, however, the data associated with the environmental conditions are outside the desired range, the controller can be configured to adjust the environmental conditions in the cabinet at step 814. For example, if a temperature sensor transmitted a temperature reading of 85 degrees Fahrenheit to the controller and the desired temperature range is between 68 and 77 degree Fahrenheit, the controller can adjust a thermostat and cause the air to be cooled to the requisite range. The controller, for example, can transmit cause the cooling coil to lower its temperature. Similarly, humidity, pressure, and other environmental conditions can similarly be adjusted by the controller.

In an embodiment, the controller cause adjust or signal one to adjust the positions of one or more barriers of the thermal curtain so as to regulate the environmental conditions in one or more of the cabinets at step 816. For example, the controller can actuate the barriers of the thermal curtain so as to cause the barriers to rotate into a different position, such as 90 degrees from its current position. Additionally, the controller can adjust a length of the barriers as well. Adjusting the length of the barriers can be performed so as to have different temperatures at different rows of the cabinets. Furthermore, rotating and adjusting the barriers of the curtain can be utilized to cause a temperature gradient between cabinets and/or rows of the cabinets. In one embodiment, the controller can signal someone to adjust the barriers. In such a case, an individual can rotate and/or adjust the length of the barriers of the thermal curtain via a hook and swivel mechanism or other similar structure. Notably, the method 800 can also include all of the operative features in the systems described above and is not intended to be limited to the description and drawings contained herein.

Upon reviewing the aforementioned embodiments, it would be evident to an artisan with ordinary skill in the art that said embodiments can be modified, reduced, or enhanced without departing from the scope and spirit of the claims described below.

The methodology and techniques described with respect to the exemplary embodiments can be performed using a machine or other computing device within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment. The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The machine may include a processor (e.g., a central processing unit (CPU), a graphics processing unit (GPU, or both), a main memory and a static memory, which communicate with each other via a bus. The machine may further include a video display unit (e.g., a liquid crystal display (LCD), a flat panel, a solid state display, or a cathode ray tube (CRT)). The machine may include an input device (e.g., a keyboard), a cursor control device (e.g., a mouse), a disk drive unit, a signal generation device (e.g., a speaker or remote control) and a network interface device.

The disk drive unit may include a machine-readable medium on which is stored one or more sets of instructions (e.g., software) embodying any one or more of the methodologies or functions described herein, including those methods illustrated above. The instructions may also reside, completely or at least partially, within the main memory, the static memory, and/or within the processor during execution thereof by the machine. The main memory and the processor also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions, or that which receives and executes instructions from a propagated signal so that a device connected to a network environment can send or receive voice, video or data, and to communicate over the network using the instructions. The instructions may further be transmitted or received over a network via the network interface device.

While the machine-readable medium is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of arrangements described herein are intended to provide a general understanding of the structure of various embodiments, and they are not intended to serve as a complete description of all the elements and features of apparatus and systems that might make use of the structures described herein. Many other arrangements will be apparent to those of skill in the art upon reviewing the above description. Other arrangements may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific arrangements have been illustrated and described herein, it should be appreciated that any arrangement calculated to achieve the same purpose may be substituted for the specific arrangement shown. This disclosure is intended to cover any and all adaptations or variations of various embodiments and arrangements of the invention. Combinations of the above arrangements, and other arrangements not specifically described herein, will be apparent to those of skill in the art upon reviewing the above description. Therefore, it is intended that the disclosure not be limited to the particular arrangement(s) disclosed as the best mode contemplated for carrying out this invention, but that the invention will include all embodiments and arrangements falling within the scope of the appended claims.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. A system for thermal management of electronic equipment, the system comprising:
    a cabinet forming an enclosure for the electronic equipment, wherein the cabinet has an inlet and an outlet;
    a supply channel connected with the cabinet inlet, wherein the cabinet is positioned on a floor and the supply channel is under the floor;
    an exhaust channel, wherein at least a portion of the exhaust channel is in proximity to the cabinet outlet; and
    a plurality of flexible barriers forming a thermal curtain for directing air exiting the outlet of the cabinet to the exhaust channel, and wherein a position of the barriers is adjustable, wherein each of the plurality of flexible barriers are independently adjustable, and wherein each of the barriers can be adjusted by performing at least one of rotating the barriers and adjusting a length of the barriers.

2. The system of claim 1, the system comprising at least one plenum in fluid communication with the supply and the exhaust channel, wherein the at least one plenum has a pressure source for generating a pressure differential through the enclosure of the cabinet causing the air to flow through the cabinet.

3. The system of claim 1, the system comprising a controller for adjusting at least one of the temperature, humidity, and pressure in the system.

4. The system of claim 1, wherein the supply channel provides cold air to the cabinet via the inlet, and wherein the exhaust channel removes hot air from the cabinet via the outlet of the cabinet.

5. A system for thermal management of electronic equipment, the system comprising:
a cabinet forming an enclosure for the electronic equipment, wherein the cabinet has an inlet and an outlet;
a supply channel connected with the cabinet inlet, wherein the cabinet is positioned on a floor and the supply channel is under the floor;
an exhaust channel, wherein at least a portion of the exhaust channel is in proximity to the cabinet outlet; and
a plurality of flexible barriers forming a thermal curtain for directing air exiting the outlet of the cabinet to the exhaust channel, and wherein a position of the barriers is adjustable, wherein the cabinet is a plurality of cabinets and the thermal curtain is a plurality of thermal curtains, wherein pairs of the plurality of cabinets face opposite each other, and wherein a thermal curtain of the plurality of thermal curtains is positioned between at least one of the pairs of the plurality of cabinets facing opposite each other.

6. A system for thermal management of electronic equipment, the system comprising:
a cabinet forming an enclosure for the electronic equipment, wherein the cabinet has an inlet and an outlet;
a supply channel connected with the cabinet inlet, wherein the cabinet is positioned on a floor and the supply channel is under the floor;
an exhaust channel, wherein at least a portion of the exhaust channel is in proximity to the cabinet outlet;
a plurality of flexible barriers forming a thermal curtain for directing air exiting the outlet of the cabinet to the exhaust channel, and wherein a position of the barriers is adjustable, and
a drop ceiling grid, wherein the drop ceiling grid comprises at least one rail, and wherein the barriers are movably connected with the rail via a hook mechanism.

7. A method comprising:
providing air flow to electronic equipment contained in a cabinet by utilizing a plenum in fluid communication with a supply channel and an exhaust channel connected to the cabinet;
directing the air flow exiting the cabinet to the plenum by utilizing a thermal curtain formed by a plurality of flexible barriers, wherein a position of one or more of the barriers is adjustable, wherein the position of the barriers is adjustable based on a hook and swivel mechanism attached to a drop ceiling grid positioned in proximity to the cabinet.

8. The method of claim 7, comprising monitoring data associated with environmental conditions in the cabinet, wherein the data is monitored by utilizing a controller.

9. The method of claim 8, comprising adjusting the environmental conditions in the cabinet based on the monitored data.

10. The method of claim 8, wherein the data associated with the environmental conditions comprise at least one of pressure data, temperature data, and humidity data.

11. The method of claim 7, comprising adjusting the position of the barriers by performing at least one of rotating the barriers and adjusting a length of the barriers.

12. The method of claim 7, cooling the air flow by utilizing a cooling coil and further comprising supplying the cooled air to the cabinet via the supply channel.

13. The method of claim 7, wherein the plenum has a pressure source for generating a pressure differential through the cabinet to provide the air flow to the electronic equipment.

14. The method of claim 7, wherein the cabinet is a plurality of cabinets, wherein the plurality of cabinets are organized in a plurality of rows, and wherein the plurality of barriers are adjusted to generate a temperature gradient in at least one row of the plurality of rows.

15. A thermal curtain for adjusting environmental conditions of a cabinet having electronic equipment, the thermal curtain comprising a plurality of flexible barriers for directing air flowing through the cabinet to an exhaust channel in fluid communication with the cabinet, wherein a plenum in fluid communication with the exhaust channel is adapted to direct the air to a cooling coil, wherein the cooling coil is adapted to cool the air, wherein the flexible barriers are connected with a drop ceiling grid by way of a hook and a swivel mechanism, and wherein the flexible barriers are adjustable by actuating the swivel mechanism.

16. The thermal curtain of claim 15, wherein a position of the barriers is adjustable by performing at least one of rotating the barriers and changing a length of the barriers.

17. The thermal curtain of claim 15, wherein the thermal curtain is a plurality of thermal curtains and the cabinet is a plurality of cabinets, wherein a thermal curtain of the plurality of thermal curtains is positioned between each pair of the plurality of cabinets and directs air flow for each pair of the plurality of cabinets.

* * * * *